United States Patent [19]

Ju

[11] Patent Number: 5,972,760

[45] Date of Patent: *Oct. 26, 1999

[54] METHOD OF MANUFACTURING A SEMICONDUCTOR DEVICE CONTAINING SHALLOW LDD JUNCTIONS

[75] Inventor: Dong-Hyuk Ju, Cupertino, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/924,639

[22] Filed: Sep. 5, 1997

[51] Int. Cl.⁶ .................................................. H01L 21/336
[52] U.S. Cl. ............................................ 438/305; 438/976
[58] Field of Search .................................... 438/305, 976, 438/FOR 442

[56] References Cited

U.S. PATENT DOCUMENTS 5,521,106  5/1996  Okabe .
5,712,204  1/1998  Horiuchi .

OTHER PUBLICATIONS

Wolf, S. and Tauber, R.N., Silicon Processing for the VLSI Era, vol. 1, Sunset Beach, California, pp. 161, 171, 1986.

*Primary Examiner*—John F. Niebling
*Assistant Examiner*—Josetta I. Jones

[57] ABSTRACT

Shallow LDD junctions are obtained by depositing a thin screening oxide layer prior to moderate or heavy ion implantations. The use of a thin deposited screening oxide, as by plasma enhanced chemical vapor deposition, instead of a thermally grown oxide, minimizes transient enhanced diffusion during annealing to activate the source/drain regions, thereby decreasing the junction depth.

19 Claims, 2 Drawing Sheets

5,972,760

METHOD OF MANUFACTURING A SEMICONDUCTOR DEVICE CONTAINING SHALLOW LDD JUNCTIONS

TECHNICAL FIELD

The present invention relates to a method of manufacturing a high density semiconductor device obtaining shallow lightly doped junctions. The present invention has particular applicability in manufacturing high density CMOS semiconductor devices with design features of 0.25 microns and under.

BACKGROUND ART

The escalating requirements for high densification and performance associated with ultra large scale integration semiconductor device require design features of 0.25 microns and under, such as under 0.18 microns, increased transistor and circuit speeds, high reliability and increased manufacturing throughput. The reduction of design features to 0.25 microns and under challenges the limitations of conventional semiconductor methodology.

As device features continually shrink in size, it becomes necessary to decrease the depth of the source and drain regions in the semiconductor substrate, i.e., the junction depth. For example, in forming a polycrystalline silicon gate having a width of about 0.25 microns, the junction depth ($X_J$) should be no greater than about 800 Å. This objective is extremely difficult to achieve, particularly when implanting boron ions to form P-type source/drain regions.

Boron is conventionally ion implanted at an implantation energy selected to determine the eventual junction depth ($X_J$) The particular implantation dosage is selected to control the concentration of the resulting source/drain regions. As boron is an extremely light element, it must be implanted at a very low energy in order to achieve a shallow $X_J$. Accordingly, boron is typically implanted at an energy of about 5 KeV.

It has been found, however, that during annealing to activate the implanted dopants, boron diffusion into the crystalline silicon layer proceeds apace, such that the junction depth of the boron exceeds the targeted maximum depth of about 800 Å. The problem of undefined dopant $X_J$ is believed to stem from various factors. For example, when boron is implanted into a monocrystalline silicon layer, interstitial atoms of silicon are generated, i.e., silicon atoms are displaced from the monocrystalline lattice. A high temperature anneal, known as the dopant activation anneal, is performed to diffuse boron into the monocrystalline silicon lattice. However, during the dopant activation anneal, boron diffuses by transient enhanced diffusion via the interstitial silicon atoms causing a very rapid diffusion into the monocrystalline silicon layer, even though implanted at a very low energy of about 5 KeV. Consequently the resulting dopant profile of boron, after the activation anneal, extends to about 2000 Å or more, which is considerably beyond the targeted maximum of about 800 Å. In copending application Ser. No. 08/726,113, a method is disclosed to minimize boron diffusion during the high temperature activation anneal by initially forming an amorphous region in which boron is ion implanted and then performing a relatively low temperature activation anneal. During the low temperature activation anneal, the amorphous region is crystallized. In copending application Ser. No. 08/992,629, an improvement in the amorphization technique is disclosed, wherein a sub-surface amorphous region is formed to minimize end-of-range defects upon crystallization.

Conventional methodology comprises ion implanting impurities into a semiconductor substrate, using the gate electrode as a mask, to form lightly doped implants. An insulating sidewall spacer is then formed on the side surfaces of the gate electrode, whereby the semiconductor substrate is exposed. A thin thermal oxide screen layer is then grown on the exposed semiconductor surface prior to ion implanting to form moderately or heavily doped implants, followed by a high temperature activation anneal. The thermal oxide screen layer reduces damage to the silicon substrate during moderate or heavy impurity implantation. However, the thermal oxide screen is formed at an elevated temperature, e.g., about 900° C., thereby causing diffusion of the lightly doped implants. Moreover, the high temperature thermal oxidation and attendant stresses induce crystalline defects in the underlying semiconductor substrate. During the high temperature activation anneal, the lightly doped implants rapidly diffuse via the crystalline defects, such as interstitials, by transient enhanced diffusion, thereby significantly increasing the $X_J$ beyond the targeted maximum of about 800 Å. Accordingly, there exists a need for semiconductor methodology in forming CMOS devices having shallow junction depths.

DISCLOSURE OF THE INVENTION

An object of the present invention is a method of manufacturing a CMOS semiconductor device having shallow junction depths.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: forming a dielectric layer on a surface of a semiconductor substrate; forming a gate electrode, having an upper surface and side surfaces, on the dielectric layer; implanting impurities, using the gate electrode as a mask, to form lightly doped implanted regions in the semiconductor substrate; depositing an insulating layer and etching to form sidewall spacers on the side surfaces of the gate electrode and on a portion of the dielectric layer adjacent the side surfaces, and to expose the surface of the semiconductor substrate adjacent the sidewall spacers; depositing a dielectric layer, having a thickness up to about 125 Å, on the exposed surface of the semiconductor substrate; implanting impurities, using the gate electrode and sidewall spacers as a mask, through the deposited dielectric layer to form moderate or heavily doped implanted regions in the semiconductor substrate; and annealing to activate the implanted impurity regions forming source/drain regions.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
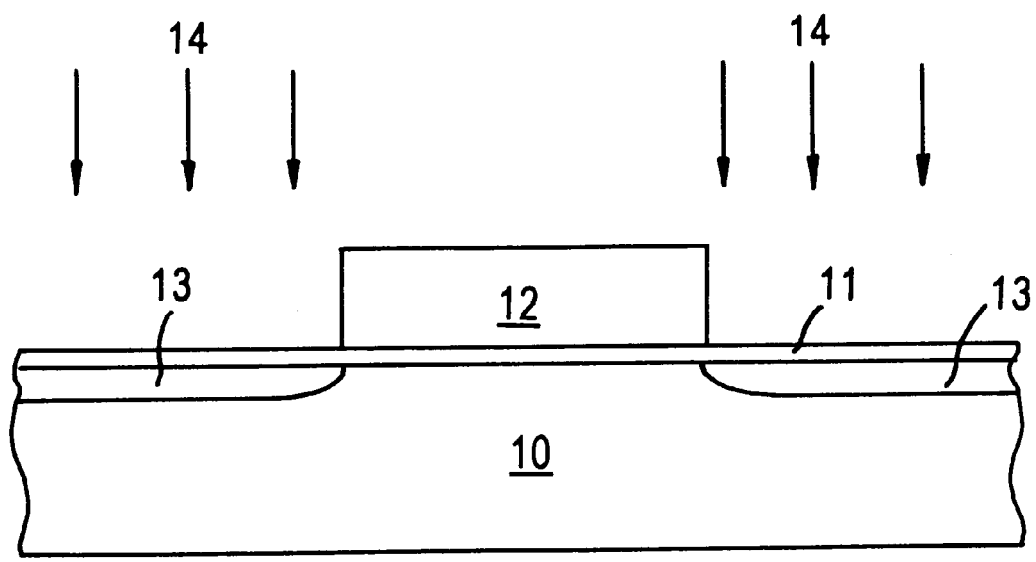
FIGS. 1 through 4 schematically illustrate sequential stages of the inventive method.

The present invention addresses and solves the transient enhanced diffusion problem of implanted impurities, thereby enabling the formation of very shallow lightly doped source/drain (LDD) junctions. Conventional methodology is fraught with the creation of crystalline defects, such as interstitials in the semiconductor substrate which increase the transient enhanced diffusion of dopants upon activation annealing. For example, in accordance with conventional methodology for forming LDD regions, a gate oxide layer is initially formed on a surface of a semiconductor substrate, a gate electrode layer deposited thereon, followed by etching to form a gate electrode on the semiconductor substrate with the gate oxide layer therebetween. Employing the gate electrode as a mask, an impurity, such as boron, is ion implanted into the semiconductor substrate at a minimal implantation energy, e.g., about 5 KeV. Such implanted impurities will form the LDD regions upon subsequent activation annealing. After such lightly doped implants, a dielectric layer, such as silicon oxide or silicon nitride, is deposited and etched to form insulating sidewall spacers on the side surfaces of the gate electrode and gate oxide layer, thereby exposing the surface of the semiconductor substrate adjacent the sidewall spacers. A thin screen oxide layer is then thermally grown on the exposed surface of the semiconductor substrate after which impurities are ion implanted into the substrate to form the moderate or heavily doped implants. Activation annealing is then conducted, whereby LDD and moderately doped (MDD) or heavily doped (HDD) regions are formed to complete the source/drain regions.

Upon experimentation and investigation, it was found that thermally growing the thin screen oxide layer on the exposed surface of the semiconductor surface, prior to the MDD/HDD implants, causes the formation of crystalline defects in the semiconductor substrate, such as dislocations, interstitials and vacancies. These crystalline defects provide a diffusion pathway for the impurities previously implanted to form the LDD implants. Thus, it was found that the thermal formation of a thin screen oxide increases the transient enhanced diffusion of LDD implants. Accordingly, upon subsequent activation anneal, the $X_J$ of the LDD region is increased to a depth considerably in excess of the targeted maximum of about 800 Å. An undesirably deep $X_J$ causes the short channel effect generating a leakage current which degrades the performance of the semiconductor device.

The present invention addresses and solves the transient enhanced diffusion problem which increases $X_J$ by eliminating the step of thermally growing a thin screen oxide layer prior to MDD/HDD ion implantation and activation anneal. Instead, according to the present invention, a thin dielectric material, such as a silicon dioxide, is deposited, preferably at a low temperature, such as less than about 450° C. For example, in accordance with an embodiment of the present invention, a thin film of silicon dioxide is deposited by chemical vapor depositions (CVD), such as plasma enhanced chemical vapor depositions (PECVD), at a controlled thickness less than about 125 Å, e.g., less than about 100 Å, at a temperature of about 400° C. to about 420° C. Other embodiments of the present invention include depositing thin films of silicon nitride, silicon oxynitride, silicon oxime by PECVD.

In depositing a thin layer of silicon dioxide by PECVD, the technique disclosed in copending application Ser. No. 08/813,021, the entire disclosure of which is hereby incorporated herein by reference, can be employed. For example, in depositing a thin layer of silicon dioxide by PECVD, a substrate support with means for heating are positioned in a chamber. The substrate support is heated to a temperature no greater than about 450° C. After heating the substrate holder, the semiconductor substrate is placed thereon and allowed to heat soak until the temperature of the semiconductor substrate rises to no greater than the temperature of the substrate holder, i.e., about 450° C, for a period of time no less than about 30 seconds. A thin layer of silicon dioxide, e.g., less than about 125 Å, is then deposited on the substrate by PECVD within the chamber.

In a preferred embodiment, the substrate holder is heated to a temperature between about 400° C. to about 420° C. and the semiconductor substrate is placed on the substrate holder to heat soak for about 30 to about 40 seconds while its temperature rises. Silane ($SiH_4$) is then introduced into the chamber at approximately 70 sccm about 0.5 to about 1.0 seconds prior to turning on the RF power. The pressure in the chamber is less than about 1.4 Torr. The RF power required is about 350 watts.

A preferred process recipe for forming a silicon dioxide layer having a uniform thickness less than about 100 Å, is as follows:

| | | |
|---|---|---|
| SiH4 | = 68 | sccm |
| N2O | = 8000 | sccm |
| N2 | = 2500 | sccm |
| HF Power | = 350 | watts |
| Pressure | = 1.2 | torr |
| Temp | = 420° | C. |
| Precoat | = 360 | secs |
| Soak time (to allow substrate and temperature to rise) | = 30 | secs |

In an embodiment of the present invention, an initial gate dielectric layer, such as silicon oxide, is formed on the semiconductor substrate and a gate electrode layer formed thereon as in conventional practices. The gate electrode layer is etched in a conventional manner to form a gate electrode on the underlying gate oxide layer. The gate electrode typically comprises doped polycrystalline silicon. Lightly doped regions are then implanted into the semiconductor substrate, typically monocrystalline silicon, employing the gate electrode as a mask. As in conventional practices, an insulating sidewall spacer is formed on each side surface of the gate electrode and underlying dielectric layer adjacent the gate electrode side surfaces. The sidewall spacers are formed by depositing a layer of dielectric material, such as a silicon nitride or silicon oxide, and etching, thereby exposing the surface of the semiconductor substrate adjacent the sidewall spacers.

The present invention departs from such conventional methodology by depositing a dielectric layer, such as silicon oxide, preferably at a relatively low temperature less than about 450° C., rather than thermally growing a silicon oxide screen layer at a temperature of about 900° C. In an embodiment of the present invention, a thin screen layer of silicon oxide is deposited by PECVD at a thickness less than about 100 Å on the exposed surface of the semiconductor substrate. Advantageously, the low temperature vapor deposition of a thin silicon dioxide screen layer avoids the extensive generation of crystalline defects attendant upon thermal oxidation. Accordingly, the degree of thermal enhanced diffusion upon subsequent activation annealing is significantly reduced with an attendant significant reduction in $X_J$. Ion implantation is then conducted to form the MDD/HDD implants followed by activation annealing to form the source/drain structures having a shallow LDD $X_J$ of less than about 800 Å. Such an embodiment of the present invention is schematically illustrated in FIGS. 1 through 4, wherein similar reference numerals denote similar features.

Figure 2:
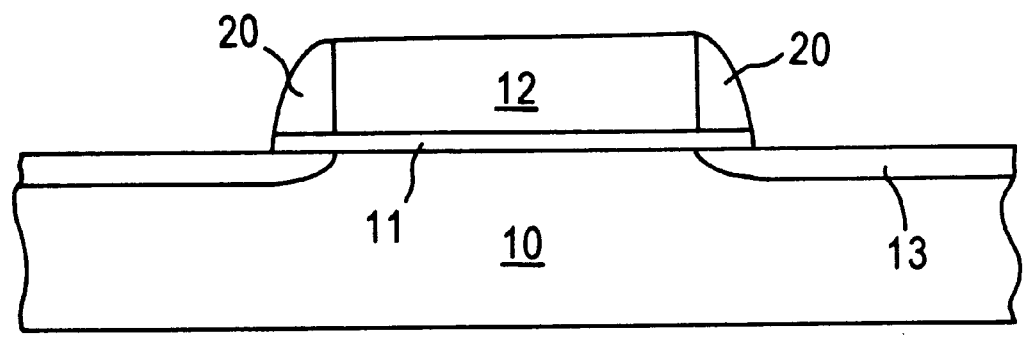

Adverting to FIG. 1, gate oxide layer 11 is formed on semiconductor substrate 10 comprising monocrystalline silicon. A gate electrode layer, such as polycrystalline silicon, is deposited and etched to form gate electrode 12. Using gate electrode 12 as a mask, impurities are ion implanted, indicated by arrow 14, at a relatively low energy, e.g., boron at about 5 KeV, to form LDD implants 13. In forming LDD implants, N- or P-type impurities are implanted, depending upon whether an N-channel MOSFET or a P-channel MOSFET is formed. Subsequent to LDD implantation, a layer of silicon dioxide or silicon nitride is deposited and etched to form sidewall spacers 20 on the side surfaces of gate electrode 12 and on the portion of gate oxide layer 11 adjacent gate electrode 12. In forming sidewall spacers 20, gate oxide layer 11 is etched, thereby exposing the surface of semiconductor substrate 10 adjacent sidewall spacers 20, as shown in FIG. 2.

Figure 3:
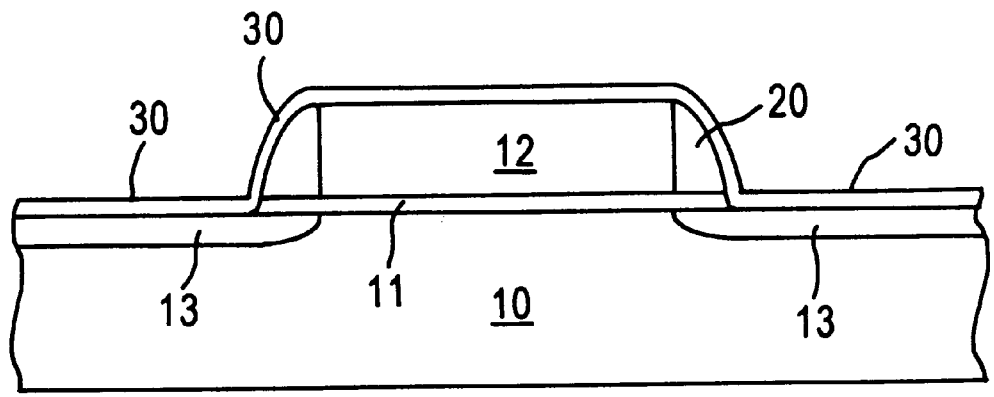

In accordance with the present invention, as shown in FIG. 3, a thin silicon dioxide screen layer 30, having a thickness less than about 100 Å, is deposited by low temperature PECVD on the exposed surface of the semiconductor substrate as well as on sidewall spacers 20 and on the upper surface of gate electrode 12. Preferably, PECVD is conducted at a temperature less than about 420° C. The use of a low temperature PECVD technique avoids the formation of crystalline defects in the semiconductor substrate which would otherwise form if the screen oxide is formed by a high temperature technique, such as thermal oxidation.

Figure 4:
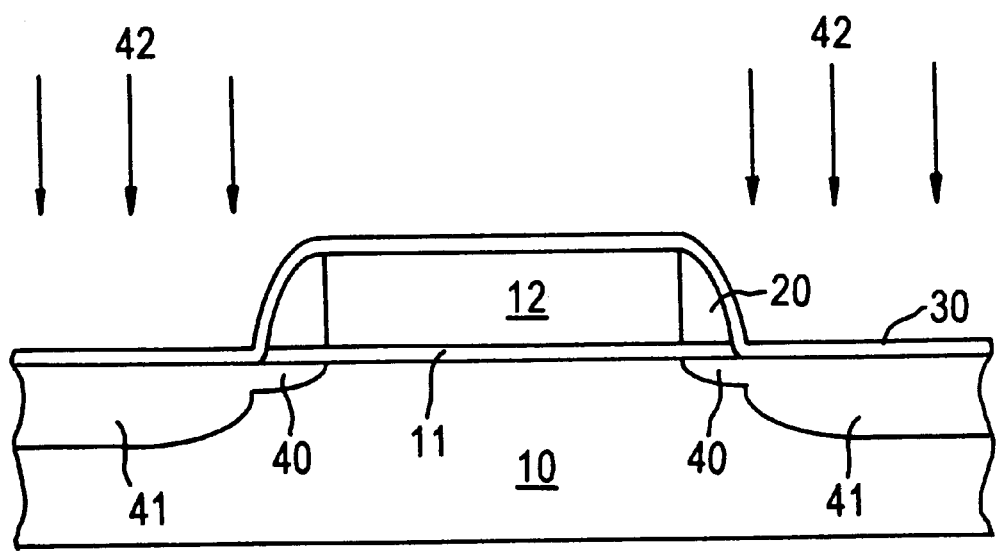

Adverting to FIG. 4, after deposition of thin silicon dioxide screen layer 30, ion implantation is conducted, as indicated by arrows 42, to form the MDD/HDD implants. An activation anneal is then conducted to form LDD regions 40 and MDD/HDD regions 41. In accordance with the present invention, the thin screen layer of silicon dioxide is deposited by low temperature PECVD, preferably at a temperature less than about 420° C., thereby avoiding the generation of significant crystalline defects in the semiconductor substrate. Accordingly, transient enhanced diffusion of the LDD implants 13 is significantly reduced during the activation annealing. As a result, LDD regions 40 exhibit an extremely shallow and desirable $X_J$ of less than about 800 Å.

The present invention is applicable to the production of various types of semiconductor devices, particularly high density, multi-metal layer semiconductor devices, with sub-micron features of 0.25 microns and below, exhibiting high speed characteristics and improved reliability. The present invention is cost-effective and can easily be integrated into conventional processing. The present invention enables the obtention of extremely shallow junction depths of less than about 800 Å, thereby avoiding narrow channel effect and consequential junction leakage with an adverse impact on device reliability.

In the previous descriptions, numerous specific details are set forth, such as specific materials, structures, chemicals, processes, etc., in order to provide a thorough understanding the present invention. However, as one having ordinary skill in the art would recognize, the present invention can be practiced without resorting to the details specifically set forth. In other instances, well known processing structures have not been described in detail in order to not unnecessarily obscure the present invention. As one having ordinary skill in the art would recognize, the deposited oxide, although exemplified by silicon dioxide, can comprise a nitride, such as silicon nitride, silicon oxynitride or silicon oxime.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a CMOS semiconductor device, which method comprises sequentially:

forming a dielectric layer on a surface of a semiconductor substrate;

forming a gate electrode, having an upper surface and side surfaces, on the dielectric layer;

implanting impurities, using the gate electrode as a mask, to form lightly doped implanted regions in the semiconductor substrate;

depositing an insulating layer and etching to form sidewall spacers on the side surfaces of the gate electrode and on a portion of the dielectric layer adjacent the side surfaces, and to expose the surface of the semiconductor substrate adjacent the sidewall spacers;

depositing a screening dielectric layer, having a thickness up to about 125 Å, on the exposed surface of the semiconductor substrate;

implanting impurities, using the gate electrode and sidewall spacers as a mask, through the deposited screening dielectric layer to form moderate or heavily doped implanted regions in the semiconductor substrate; and annealing to activate the implanted impurity regions forming source/drain regions.

2. The method according to claim 1, comprising depositing the screening dielectric layer by chemical vapor deposition.

3. The method according to claim 2, comprising depositing the screening dielectric layer by plasma enhanced chemical vapor deposition.

4. The method according to claim 3, wherein the screening dielectric layer comprises silicon oxide.

5. The method according to claim 4, wherein the screening deposited oxide layer has a thickness up to about 100 Å.

6. The method according to claim 1, wherein the screening dielectric layer is also deposited on the upper surface of the gate electrode.

7. The method according to claim 3, comprising implanting N-type impurities at an impurity dosage of about $5 \times 10^{13}$ atoms $cm^{-2}$ to about $5 \times 10^{14}$ atoms $cm^{-2}$ and at an implantation energy of about 10 KeV to about 30 KeV to form the lightly doped implants of an N-channel MOSFET.

8. The method according to claim 7, comprising implanting N-type impurities at an implantation dosage of about $5 \times 10^{14}$ atoms $cm^{-2}$ to about $5 \times 10^{15}$ atoms $cm^{-2}$ and at an implantation energy of about 40 KeV to about 60 KeV form the moderate or heavily doped implants of the N-channel MOSFET.

9. The method according to claim 3, comprising implanting P-type impurities at an implantation dosage of about $5 \times 10^{13}$ atoms $cm^{-2}$ to about $5 \times 10^{14}$ atoms $cm^{-2}$ and an implantation energy of about 5 KeV to about 10 KeV to form the lightly doped implants of a P-channel MOSFET.

10. The method according to claim 9, comprising implanting P-type impurities at an implantation dosage of about $5 \times 10^{14}$ atoms cm$^2$ to about $5 \times 10^{15}$ atoms cm$^{-2}$ and an implantation energy of about 20 KeV to about 40 KeV to form the moderate or heavy implants of the P-channel MOSFET.

11. The method according to claim 3, comprising annealing at a temperature of about 900° C to about 1,100° C. to activate the impurity implanted regions.

12. The method according to claim 11, wherein the activated source/drain regions extend into the semiconductor substrate to a lightly doped junction depth less than about 800 Å.

13. The method according to claim 1, wherein the screening dielectric layer comprises a silicon oxime, an oxide, a nitride, or an oxynitride, and is deposited by plasma enhanced chemical vapor deposition.

14. The method according to claim 13, comprising depositing screening silicon dioxide.

15. The method according to claim 13, comprising depositing silicon nitride.

16. The method according to claim 3, comprising depositing the screening oxide layer at a temperature less than 450° C.

17. The method according to claim 16, comprising:
placing the semiconductor substrate on a substrate holder preheated to a temperature up to about 450° C. in a deposition chamber;
allowing the semiconductor substrate to heat soak for at least about 30 seconds and, thereby, heat to a temperature less than about 450° C.; and
depositing the screening oxide layer on the semiconductor substrate at a thickness less than about 125 Å.

18. The method according to claim 17, comprising preheating the substrate holder to a temperature of about 400° C. to about 420° C.

19. The method according to claim 17, comprising:
introducing silane into the deposition chamber at less than about 70 sccm for about 0.5 to about 1.0 seconds prior to initiating RF power;
providing a pressure less than about 0.4 Torr; and
initiating an RF power of about 350 watts.

* * * * *

UNITED STATES PATENT AND TRADEMARK OFFICE
CERTIFICATE OF CORRECTION

PATENT NO. : 5,972,760
DATED : Oct. 26, 1999
INVENTOR(S) : Ju

It is certified that error appears in the above-identified patent and that said Letters Patent is hereby corrected as shown below:

Claim 8, line 4, after "60 KeV" insert --to--; in Claim 10, line 3 after the word "atoms" (the first occurrence), the expression should read --$cm^{-2}$--, and in Claim 15, line 2, before the word "silicon" insert --a screening dielectric layer comprising--.

Signed and Sealed this

Thirtieth Day of May, 2000

Attest:

Q. TODD DICKINSON

*Attesting Officer*  *Director of Patents and Trademarks*